(12) United States Patent
Ozawa et al.

(10) Patent No.: US 7,901,997 B2
(45) Date of Patent: Mar. 8, 2011

(54) METHOD OF MANUFACTURING SEMICONDUCTOR DEVICE

(75) Inventors: Takashi Ozawa, Nagano (JP); Seiji Sato, Nagano (JP); Masao Nakazawa, Nagano (JP); Mitsuyoshi Imai, Nagano (JP); Masatoshi Nakamura, Nagano (JP); Kei Imafuji, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 10 days.

(21) Appl. No.: 12/021,664

(22) Filed: Jan. 29, 2008

(65) Prior Publication Data

US 2008/0188040 A1    Aug. 7, 2008

(30) Foreign Application Priority Data

Feb. 5, 2007    (JP) ................. 2007-025861

(51) Int. Cl.
*H01L 21/00* (2006.01)
(52) U.S. Cl. ......... 438/125; 438/106; 438/108; 438/612; 438/613; 257/778; 257/786; 257/737; 257/E21.511
(58) Field of Classification Search .................. 438/108, 438/124, 612–614, 637; 257/737, 778, 779
See application file for complete search history.

(56) References Cited

U.S. PATENT DOCUMENTS

| | | | |
|---|---|---|---|
| 2003/0001286 A1 * | 1/2003 | Kajiwara et al. | 257/778 |
| 2006/0065978 A1 * | 3/2006 | Nishiyama et al. | 257/737 |
| 2006/0201997 A1 * | 9/2006 | Tung | 228/101 |
| 2006/0279000 A1 * | 12/2006 | Chang et al. | 257/779 |
| 2009/0302450 A1 * | 12/2009 | Ohde et al. | 257/687 |

FOREIGN PATENT DOCUMENTS

JP    8-148496    6/1996

* cited by examiner

*Primary Examiner* — William M Brewster
*Assistant Examiner* — Wilner Jean Baptiste
(74) *Attorney, Agent, or Firm* — Rankin, Hill & Clark LLP

(57) ABSTRACT

A solder 14 is formed, by a plating method, on a connecting surface 21A and a side surface 21B in a connecting pad 21 of a wiring board 11 which is opposed to a metal bump 13 formed on an electrode pad 31 of a semiconductor chip 12, and subsequently, the solder 14 is molten to form an accumulated solder 15 taking a convex shape on the connecting surface 21A of the connecting pad 21 and the metal bump 13 is then mounted on the connecting surface 21A of the connecting pad 21 on which the accumulated solder is formed, and the accumulated solder 15 and the metal bump 13 are thus bonded to each other.

6 Claims, 8 Drawing Sheets

METHOD OF MANUFACTURING SEMICONDUCTOR DEVICE

BACKGROUND OF THE INVENTION

The present invention relates to a method of manufacturing a semiconductor device, and more particularly to a method of manufacturing a semiconductor device in which a solder provided on a connecting pad of a wiring board and a metal bump provided on an electrode pad of a semiconductor chip are bonded to flip chip connect the semiconductor chip to the wiring board.

Besides, for example, an Au bump or a Cu bump are used as the metal bump.

In some conventional semiconductor devices, a solder provided on a connecting pad of a wiring board and a metal bump provided on an electrode pad of a semiconductor chip are bonded to flip chip connect the semiconductor chip to the wiring board (see FIG. 1).

FIG. 1 is a sectional view showing the conventional semiconductor device.

With reference to FIG. 1, a conventional semiconductor device 100 comprises a wiring board 101, a semiconductor chip 102, a metal bump 103, a solder 104, an underfill resin 105, and a solder ball 115.

The wiring board 101 has a board body 106, a via 107, a connecting pad 108, solder resists 109 and 114, a wiring 110, and a pad 112.

The board body 106 is a core substrate. As the board body 106, it is possible to use a glass epoxy resin or a tape-like resin, for example.

The via 107 is provided to penetrate through the board body 106. The connecting pad 108 is provided on an upper surface 106A of the board body 106 in a corresponding portion to a position in which the via 107 is formed. The connecting pad 108 is connected to the via 107.

The solder resist 109 is provided on the upper surface 106A of the board body 106 to expose the connecting pad 108. The wiring 110 is provided on a lower surface 106B of the board body 106 in a corresponding portion of the position in which the via 107 is formed. The wiring 110 is connected to the via 107. Consequently, the wiring 110 is electrically connected to the connecting pad 108 through the via 107.

The pad 112 is provided on the lower surface 106B of the board body 106. The pad 112 is connected to the wiring 110. The solder resist 114 is provided on the lower surface 106B of the board body 106 to expose the pad 112.

The semiconductor chip 102 has a plurality of electrode pads 116. The electrode pads 116 are electrically connected to an integrated circuit provided on the semiconductor chip 102. As a material of the electrode pad 116, it is possible to use Al, for example.

The metal bump 103 is provided on the electrode pads 116. The metal bump 103 is provided in contact with the connecting pad 108. Consequently, the semiconductor chip 102 is electrically connected to the connecting pad 108 through the metal bump 103.

The solder 104 is provided on the connecting pad 108. The solder 104 serves to fix the metal bump 103 onto the connecting pad 108. As the solder 104, it is possible to use an Sn solder or an Sn based alloy solder which is formed by a nonelectrolytic plating method, for example. The solder 104 formed by a plating method as well as the nonelectrolytic plating method includes a large number of fine voids. In the case in which the Sn solder or the Sn based alloy solder is used as the solder 104, it is preferable that a thickness should be equal to or smaller than 1 μm, for example. By reducing the thickness of the solder 104, thus, it is possible to prevent the Sn contained in the solder 104 having the fine voids from being diffused into the electrode pad 116 through the metal bump 103, resulting in a non-conduction between the electrode pad 116 and the metal bump 103 in a heat treatment in a formation of the solder ball 115 (a heating temperature is approximately 230° C. to 260° C.) or a high temperature inspection of the semiconductor device 100.

The underfill resin 105 is provided to fill a clearance between the semiconductor chip 102 and the wiring board 101. The underfill resin 105 serves to compensate for a connecting strength between the semiconductor chip 102 and the wiring board 101.

The solder ball 115 is provided on the pad 112 of the wiring board 101. The solder ball 115 is an external connecting terminal for electrically connecting a mounting board (not shown) such as a mother board and the semiconductor device 100.

FIGS. 2 to 7 are views showing a process for manufacturing the conventional semiconductor device.

With reference to FIGS. 2 to 7, description will be given to a method of manufacturing the conventional semiconductor device 100. First of all, at a step shown in FIG. 2, the wiring board 101 is formed by a well-known technique. At a step shown in FIG. 3, subsequently, the solder 104 is formed on at least the upper surface of the connecting pad 108 by a non-electrolytic plating method. A thickness of the solder 104 is set to be equal to or smaller than 1 μm. For the solder 104, for example, an Sn solder or an Sn based alloy solder is used.

At a step shown in FIG. 4, next, the metal bump 103 is formed on the electrode pads 106 provided on the semiconductor chip 102. At a step shown in FIG. 5, then, a high pressure is applied to cause the metal bump 103 to come in contact with the connecting pad 108. Thereafter, the solder 104 is subjected to a reflow. Thus, the connecting pad 108 and the metal bump 103 are electrically connected to each other.

At a step shown in FIG. 6, next, the underfill resin 105 is formed to fill the clearance between the semiconductor chip 102 and the wiring board 101 by a capillarity.

At a step shown in FIG. 7, subsequently, the solder ball 115 is formed on the pad 112 of the wiring board 101 in a state in which the structure shown in FIG. 6 is heated. Consequently, there is manufactured the semiconductor device 100 in which the semiconductor chip 102 and the wiring board 101 are flip chip connected to each other (for example, see Patent Document 1) [Patent Document 1] JP-A-8-148496

In the conventional semiconductor device 100, however, the solder 104 having a small thickness (1 μm or less) is formed on the connecting pad 108 and is bonded to the metal bump 103. For this reason, there is a problem in that the bonding portion of the solder 104 and the metal bump 103 is broken, resulting in a deterioration in an electrical connecting reliability between the wiring board 101 and the semiconductor chip 102 due to a difference in a coefficient of thermal expansion between the wiring board 101 and the semiconductor chip 102 when a temperature of the solder 104 subjected to the reflow is lowered to a room temperature.

In the case in which a material of the substrate body 106 is soft (for example, a tape-like resin) or the case in which the structure of the electrode pad 116 is fragile, moreover, it is hard to cause the metal bump 103 to come in contact with the connecting pad 108 in a state in which a high pressure is applied. Therefore, there is a problem in that the electrical connecting reliability between the wiring board 101 and the semiconductor chip 102 is deteriorated.

In the case in which there is a variation in a height between the metal bumps 103 or the case in which a warpage is generated on the wiring board 101, furthermore, the solder 104 does not come in contact with the metal bump 103. For this reason, there is a problem in that the metal bump 103 cannot be electrically connected to the connecting pad 108.

SUMMARY OF THE INVENTION

Therefore, the invention has been made in consideration of the problems and has an object to provide a method of manufacturing a semiconductor device which can prevent Sn contained in a solder from being diffused into an electrode pad of a semiconductor chip through a metal bump and can enhance an electrical connecting reliability between a wiring board and the semiconductor chip.

According to a first aspect of the invention, there is provided a method of manufacturing a semiconductor device including a semiconductor chip having a plurality of electrode pads and a wiring board having a connecting pad which is opposed to the electrode pads, a metal bump provided on the electrode pads being bonded to a solder provided on the connecting pad, to flip-chip connect the semiconductor chip to the wiring board, the method including:

a solder forming step of forming the solder on a connecting surface of the connecting pad which is opposed to the metal bump and a side surface of the connecting pad by a plating method, an accumulated solder forming step of melting the solder to form an accumulated solder taking a convex shape on the connecting surface of the connecting pad, and a bonding step of mounting the metal bump on the connecting surface provided with the accumulated solder, to bond the accumulated solder to the metal bump.

According to the invention, by melting the solder, it is possible to move the solder in the portion positioned on the side surface of the connecting pad to the connecting surface of the connecting pad with a surface tension, thereby forming the accumulated solder having a greater thickness than a solder formed by a plating method on the connecting surface of the connecting pad. Also in the case in which the metal bump has a variation in a height or the case in which a warpage is generated on the wiring board, consequently, it is possible to bond the metal bump to the connecting pad. Therefore, it is possible to enhance an electrical connecting reliability between the wiring board and the semiconductor chip.

By melting the solder before bonding the metal bump to the connecting pad, moreover, it is possible to eliminate a fine void present in the solder formed by the plating method from the solder (including the accumulated solder), thereby causing the solder (including the accumulated solder) to have a compact structure. Therefore, it is possible to prevent Sn contained in the accumulated solder from being diffused into the electrode pad provided in the semiconductor chip through the metal bump at a heat treating step in a formation, on the wiring board, of a solder ball to be an external connecting terminal of the semiconductor device or a high temperature inspecting step of the semiconductor device, for example.

Moreover, according to a second aspect of the invention, the solder is formed by an electrolytic plating method at the solder forming step. Consequently, it is possible to form a thicker solder than a solder formed by a nonelectrolytic plating method on the connecting surface and the side surface in the connecting pad. Thus, it is possible to increase the height of the accumulated solder.

Furthermore, according to a third aspect of the invention, the solder is melted by heating the solder at a temperature which is equal to or higher than a melting point of the solder and is lower than a heat resistant temperature of the semiconductor chip at the accumulated solder forming step. Consequently, it is possible to prevent the semiconductor chip from being broken by a heat for melting the solder.

In addition, according to a forth aspect of the invention, an underfill resin forming step of forming an underfill resin to fill a clearance between the semiconductor chip and the wiring board after the bonding step is included. Consequently, it is possible to increase a connecting strength between the semiconductor chip and the wiring board.

According to the invention, it is possible to prevent the Sn contained in the solder from being diffused into the electrode pad of the semiconductor chip through the metal bump and to enhance an electrical connecting reliability between the wiring board and the semiconductor chip.

DETAILED DESCRIPTION OF THE PREFERRED EMBODIMENTS

Next, an embodiment according to the invention will be described with reference to the drawings.

Figure 1:
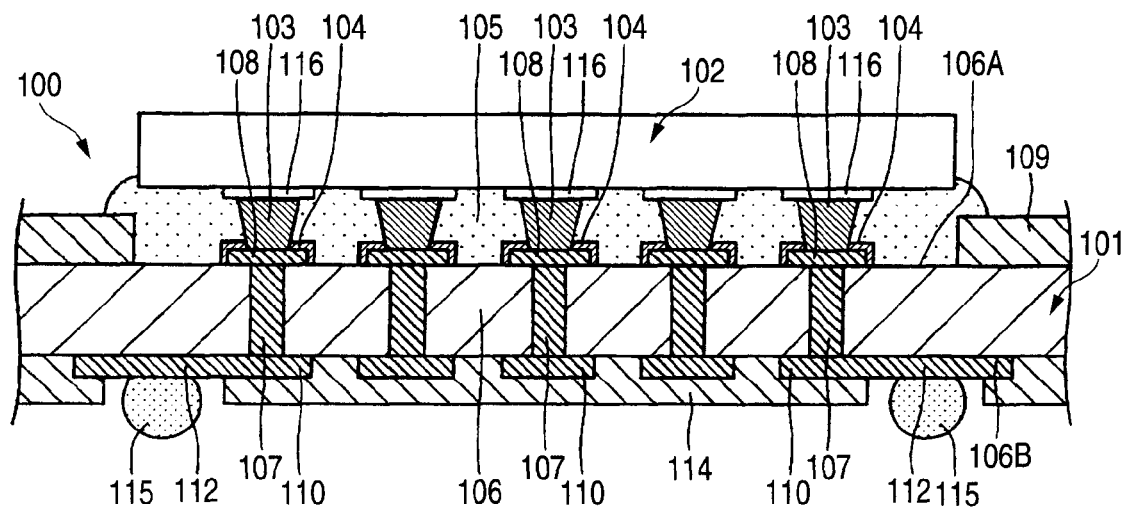
FIG. 1 is a sectional view showing a conventional semiconductor device.
Figure 2:
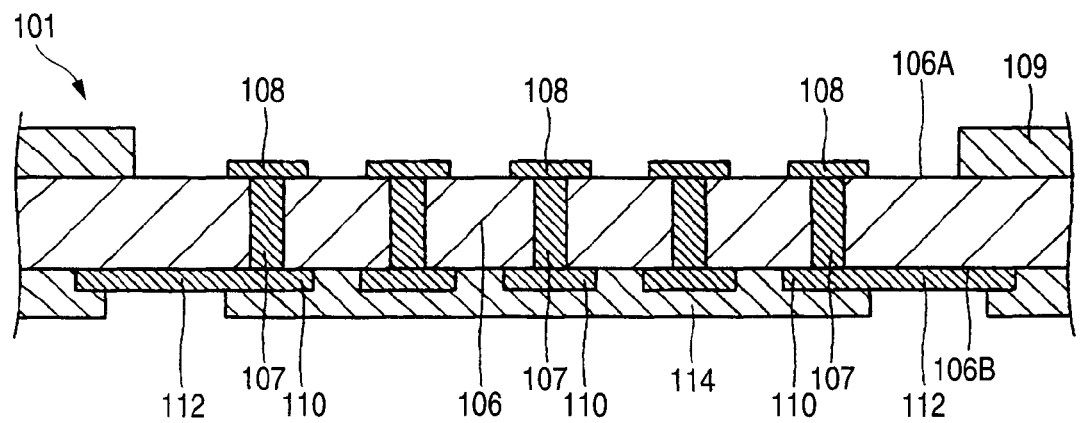
FIG. 2 is a view (No. 1) showing a step of manufacturing the conventional semiconductor device.
Figure 3:
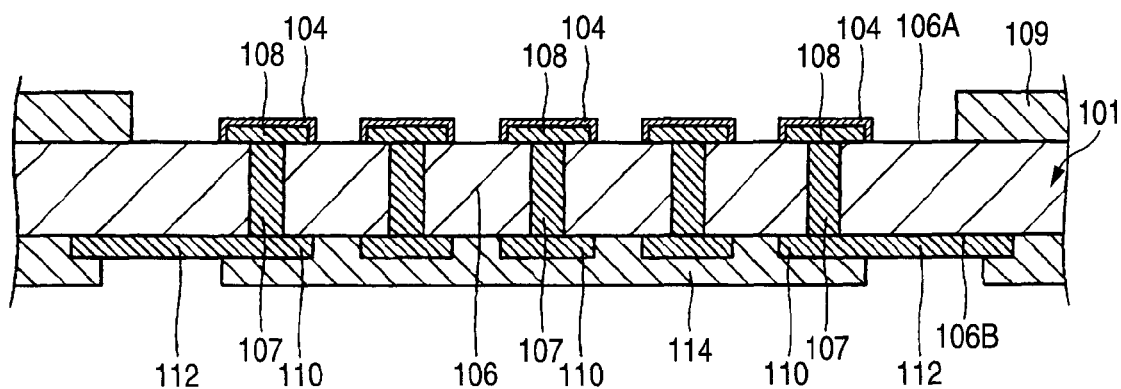
FIG. 3 is a view (No. 2) showing a step of manufacturing the conventional semiconductor device.
Figure 4:
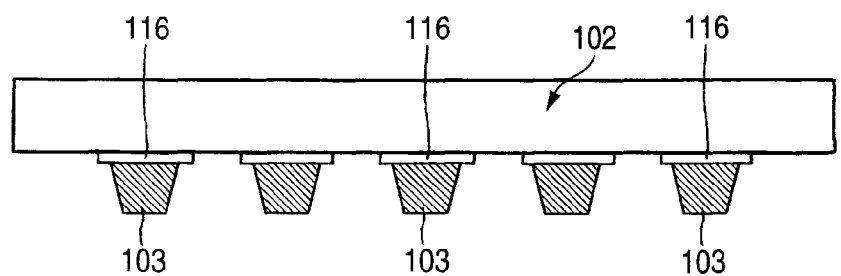
FIG. 4 is a view (No. 3) showing a step of manufacturing the conventional semiconductor device.
Figure 5:
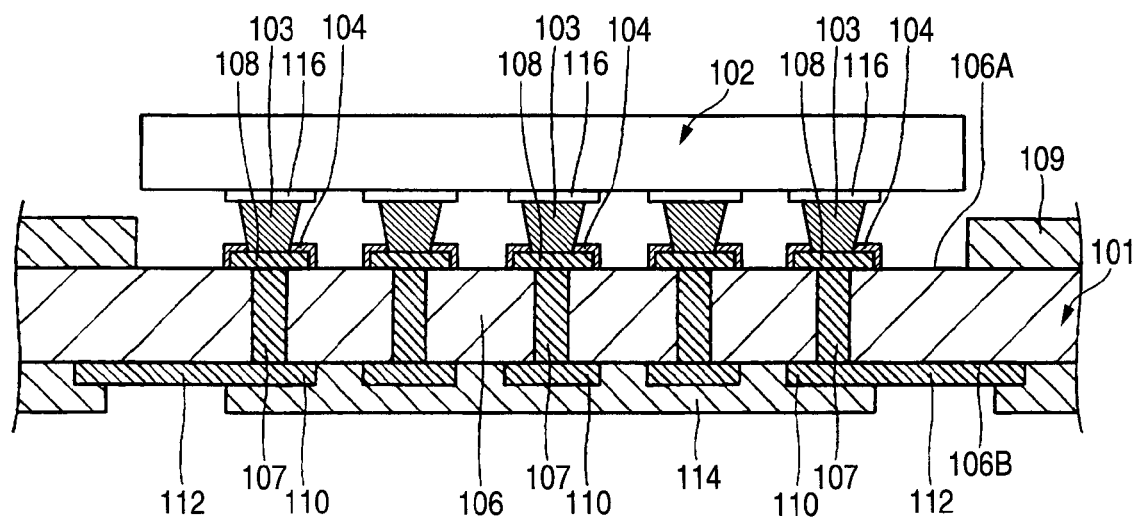
FIG. 5 is a view (No. 4) showing a step of manufacturing the conventional semiconductor device.
Figure 6:
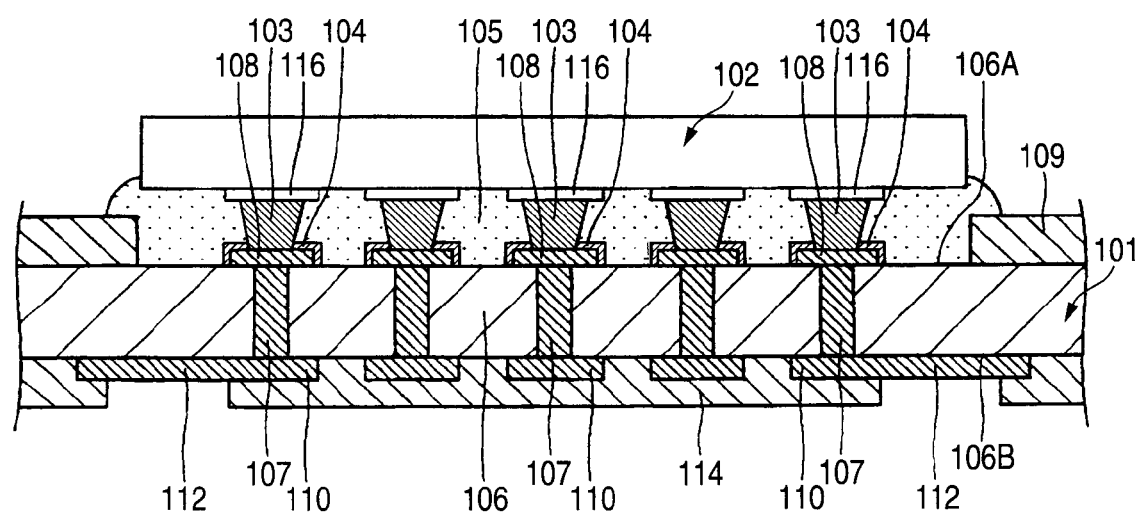
FIG. 6 is a view (No. 5) showing a step of manufacturing the conventional semiconductor device.
Figure 7:
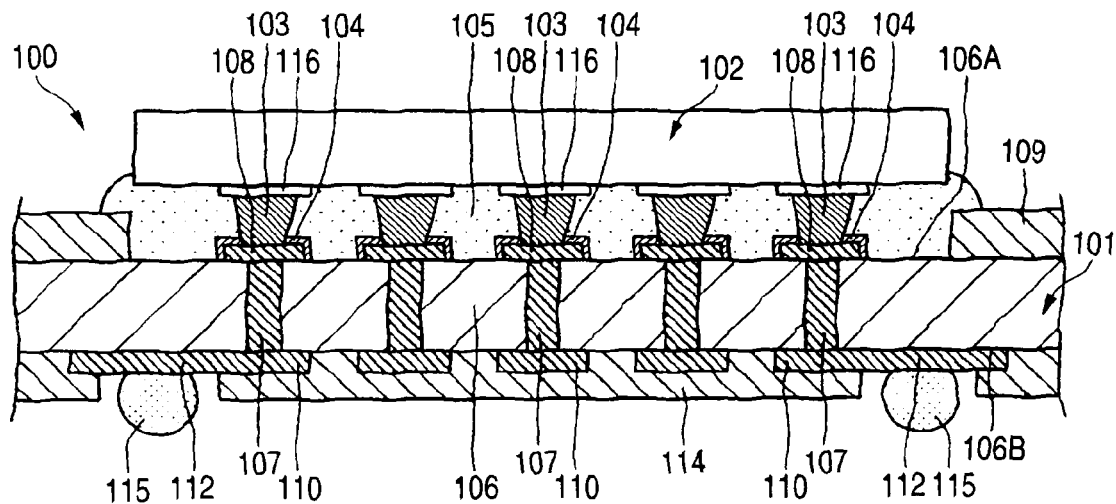
FIG. 7 is a view (No. 6) showing a step of manufacturing the conventional semiconductor device.
Figure 8:
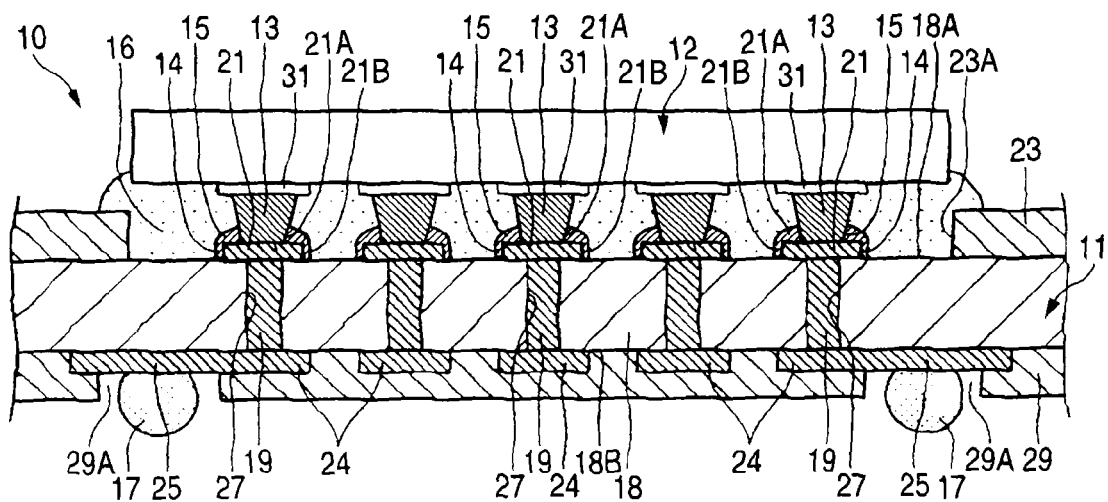
FIG. 8 is a sectional view showing a semiconductor device according to an embodiment of the invention.

FIG. 8 is a sectional view showing a semiconductor device according to the embodiment of the invention.

With reference to FIG. 8, a semiconductor device 10 according to the embodiment comprises a wiring board 11, a semiconductor chip 12, a metal bump 13, a solder 14, an accumulated solder 15, an underfill resin 16, and a solder ball 17.

The wiring board 11 has a board body 18, a via 19, a connecting pad 21, solder resists 23 and 29, a wiring 24, and a pad 25.

The board body 18 is a core substrate. A plurality of through holes 27 is formed on the board body 18. As the board body 18, it is possible to use a plate-shaped resin board or a tape-like resin board, for example.

The via 19 is provided on the through holes 27. The via 19 has one of ends connected to the connecting pad 21 and the other end connected to the wiring 24. As a material of the via 19, it is possible to use Cu, for example.

The connecting pad 21 is provided on an upper surface 18A of the board body 18 in a corresponding portion to a position in which the via 19 is formed. The connecting pad 21 is connected to an upper end of the via 19. The connecting pad 21 has a connecting surface 21A which is opposed to the metal bump 13. As a material of the connecting pad 21, it is possible to use Cu, for example.

The solder resist 23 is provided on the upper surface 18A of the board body 18. The solder resist 23 has an opening portion 23A for exposing the connecting pads 21.

The wiring 24 is provided on a lower surface 18B of the board body 18 in a corresponding portion to the position in which the via 19 is formed. The wiring 24 is connected to a lower end of the via 19. As a material of the wiring 24, it is possible to use Cu, for example.

The pad 25 is provided on the lower surface 18B of the board body 18. The pad 25 is connected to the wiring 24. The pad 25 serves to provide the solder ball 17 to be an external connecting terminal. As a material of the pad 25, it is possible to use Cu, for example.

The solder resist 29 is provided on the lower surface 18B of the board body 18 to cover the wiring 24. The solder resist 29 has an opening portion 29A for exposing the pad 25.

The semiconductor chip 12 has a semiconductor substrate (not shown), an integrated circuit (not shown) formed on the semiconductor substrate, and a plurality of electrode pads 31 which is electrically connected to the integrated circuit.

The metal bump 13 is provided on the electrode pads 31. The metal bump 13 has one of ends provided in contact with the connecting surface 21A of the connecting pad 21. The metal bump 13 serves to electrically connect the semiconductor chip 12 to the wiring board 11. A height of the metal bump 13 can be set to 30 μm, for example.

The solder 14 is provided on a side surface 21B of the connecting pad 21. The solder 14 is obtained as follows. A solder is formed on the connecting surface 21A and the side surface 21B in the connecting pad 21 by a plating method (see a step shown in FIG. 10 which will be described below) and the solder is then molten (see a step shown in FIG. 12 which will be described below). At this time, the solder is not moved to the connecting surface 21A of the connecting pad 21 but is left on the side surface 21B of the connecting pad 21 so that the solder 14 is obtained. As the solder 14, it is possible to use an Sn solder, an Sn—Ag solder, an Sn—Cu solder and an Sn—Ag—Cu solder, for example.

The accumulated solder 15 is provided on the connecting surface 21A of the connecting pad 21. The accumulated solder 15 takes a convex shape. The accumulated solder 15 is bonded to the metal bump 13. Consequently, the semiconductor chip 12 and the wiring board 11 are flip chip connected to each other. The accumulated solder 15 is constituted by the solder formed on the connecting surface 21A of the connecting pad 21 through the plating method and any of the molten solder which is provided on the side surface 21B of the connecting pad 21 and is moved to the connecting surface 21A of the connecting pad 21 with a surface tension. For the solder constituting the accumulated solder 15, it is possible to use the same solder as the solder constituting the solder 14. A thickness of the accumulated solder 15 (a thickness of the accumulated solder 15 in a portion to which the metal bump 13 is bonded) can set to 3 μm to 9 μm, for example.

Thus, the accumulated solder 15 having a greater thickness than the conventional solder 104 is provided on the connecting surface 21A of the connecting pad 21 which is opposed to the metal bump 13. Also in the case in which the metal bump 13 has a variation in a height or the case in which a warpage is generated on the wiring board 11, consequently, it is possible to bond the metal bump 13 to the connecting pad 21. Therefore, it is possible to enhance an electrical connecting reliability between the wiring board 11 and the semiconductor chip 12.

The underfill resin 16 is provided to fill a clearance formed between the semiconductor chip 12 and the wiring board 11. The underfill resin 16 serves to increase a connecting strength between the semiconductor chip 12 and the wiring board 11 (particularly, a strength of a bonding portion of the accumulated solder 15 and the metal bump 13).

The solder ball 17 is provided on the pad 25 of the wiring board 11. The solder ball 17 is an external connecting terminal for electrically connecting a mounting substrate (not shown) such as a mother board and the semiconductor substrate 10.

According to the semiconductor device in accordance with the embodiment, the accumulated solder 15 having a greater thickness than the conventional solder 104 is provided on the connecting surface 21A of the connecting pad 21 which is opposed to the metal bump 13. Also in the case in which the metal bump 13 has a variation in a height or the case in which a warpage is generated on the wiring board 11, consequently, it is possible to bond the metal bump 13 to the connecting pad 21. Consequently, it is possible to enhance the electrical connecting reliability between the wiring board 11 and the semiconductor chip 12.

FIGS. 9 to 15 are views showing a process for manufacturing the semiconductor device according to the embodiment of the invention. In FIGS. 9 to 15, the same portions as those in the semiconductor device 10 according to the embodiment have the same reference numerals.

With reference to FIGS. 9 to 15, description will be given to a method of manufacturing the semiconductor device 10 according to the embodiment. First of all, at a step shown in FIG. 9, the wiring board 11 is formed by a well-known technique.

Figure 10:
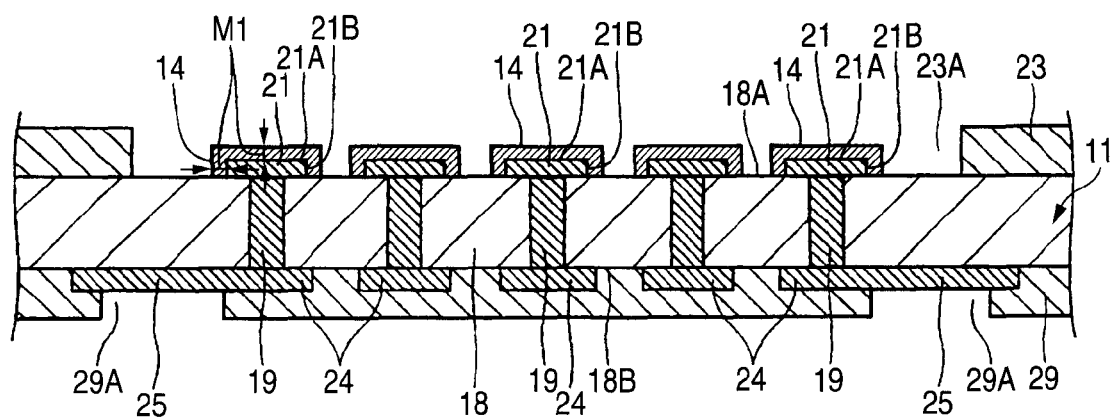
FIG. 10 is a view (No. 2) showing a step of manufacturing the semiconductor device according to the embodiment of the invention.

At a step shown in FIG. 10, subsequently, the solder 14 is formed on the connecting surface 21A and the side surface 21B in the connecting pad 21 by a plating method (a solder forming step). More specifically, it is preferable to form the solder 14 through an electrolytic plating method. Thus, the solder 14 is formed by using the electrolytic plating method. As compared with the case in which a nonelectrolytic plating method is used, consequently, it is possible to increase a thickness M1 of the solder 14. Thus, it is possible to increase a thickness of the accumulated solder 15 formed at a step shown in FIG. 12 which will be described below.

The thickness M1 of the solder 14 which is formed on the connecting surface 21A and the side surface 21B in the connecting pad 21 can be set to 1 μm to 3 μm, for example. As the solder 14, moreover, it is possible to use an Sn solder or an Sn based alloy solder, for example. As the Sn based alloy solder, it is possible to use an Sn—Ag solder, an Sn—Cu solder or an Sn—Ag—Cu solder, for example.

Figure 11:
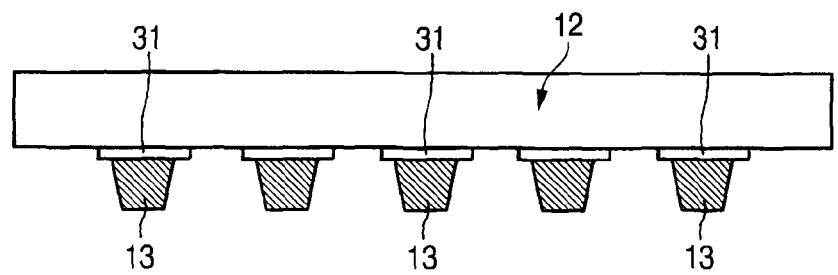
FIG. 11 is a view (No. 3) showing a step of manufacturing the semiconductor device according to the embodiment of the invention.

At a step shown in FIG. 11, next, the metal bump 13 is formed on the electrode pads 31 provided on the semiconductor chip 12. The metal bump 13 can be formed by the electrolytic plating method or an Au wire, for example.

Figure 9:
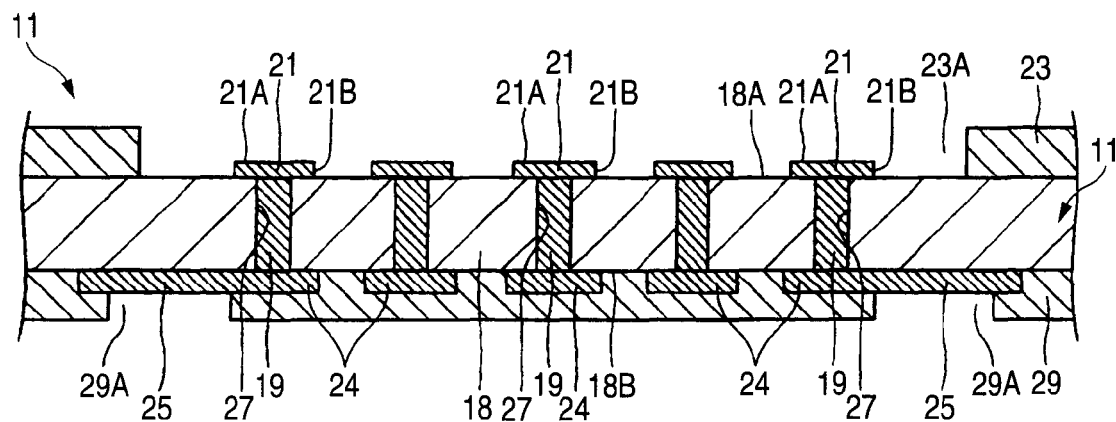
FIG. 9 is a view (No. 1) showing a step of manufacturing the semiconductor device according to the embodiment of the invention.
Figure 12:
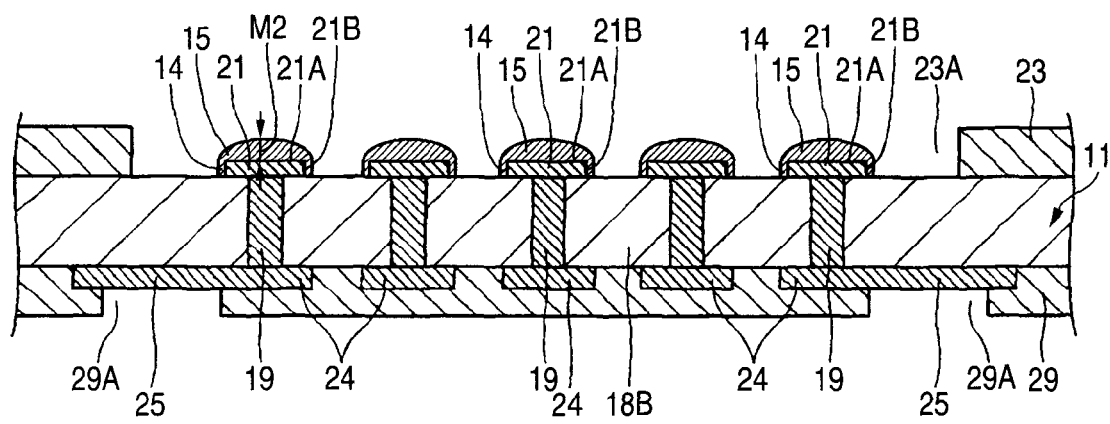
FIG. 12 is a view (No. 4) showing a step of manufacturing the semiconductor device according to the embodiment of the invention.

At a step shown in FIG. 12, then, the structure shown in FIG. 9 is heated to a melting point of the solder 14 or more, and the solder 14 is thus molten (remolten). Consequently, a part of the solder 14 formed on the side surface 21B of the connecting pad 21 is collected into the connecting surface 21A of the connecting pad 21 with a surface tension so that the accumulated solder 15 taking a convex shape is formed on the connecting surface 21A of the connecting pad 21 (an accumulated solder forming step). It is preferable that a temperature for melting the solder 14 should be set to be equal to or higher than the melting point of the solder 14 and be lower than the heat resistant temperature of the semiconductor chip 12 (for example, 300° C.). By setting the temperature, it is possible to prevent the semiconductor chip 12 from being broken by the heat for melting the solder 14.

It is preferable that a thickness M2 of the accumulated solder 15 should be 3 μm to 9 μm, for example. For instance, in the case in which the thickness M1 of the solder 14 is 3 μm, the solder 14 is molten so that the thickness M2 of the accumulated solder 15 is set to be approximately 8 μm.

Thus, the accumulated solder 15 having a greater thickness than the solder 104 formed on the connecting pad 108 according to the conventional art is formed on the connecting surface 21A. Also in the case in which the metal bump 13 has a variation in a height or the case in which a warpage is generated on the wiring board 11, consequently, it is possible to bond the accumulated solder 15 to the metal bump 13. Therefore, it is possible to enhance the electrical connecting reliability between the wiring board 11 and the semiconductor chip 12.

Before the metal bump 13 and the accumulated solder 15 are bonded to each other, moreover, the solder 14 is molten. Consequently, it is possible to eliminate a fine void present in the solder 14 formed by the plating method from the solder 14 (the solder provided on the connecting surface 21A of the connecting pad 21) and the accumulated solder 15. Thus, the solder 14 (the solder provided on the connecting surface 21A of the connecting pad 21) and the accumulated solder 15 have compact structures. Therefore, the Sn contained in the accumulated solder 15 can be prevented from being diffused into the electrode pad 31 through the metal bump 13 at a heat treating step in a formation of the solder ball 17 on the pad 25 of the wiring board 11 (see FIG. 15) or a high temperature inspecting step of the semiconductor device 10, for example.

Figure 13:
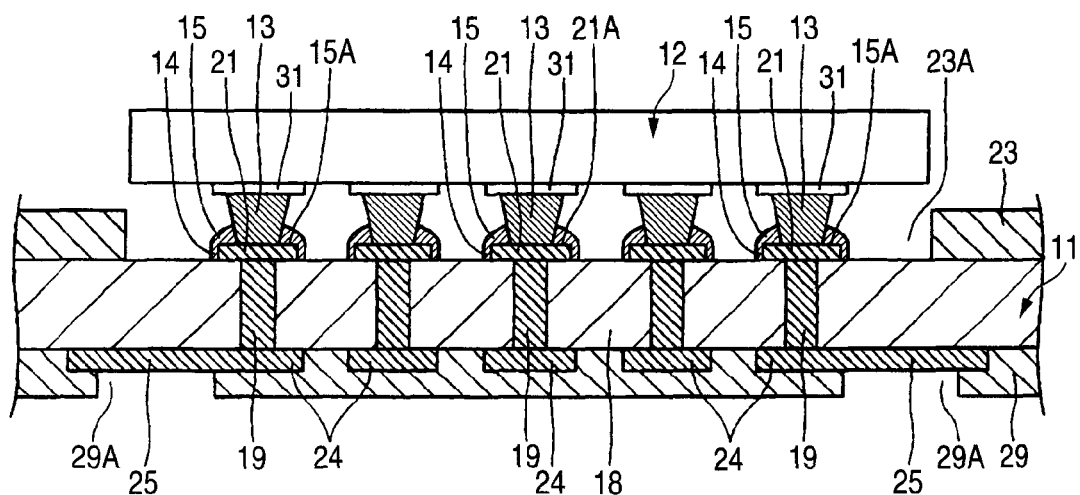
FIG. 13 is a view (No. 5) showing a step of manufacturing the semiconductor device according to the embodiment of the invention.

At a step shown in FIG. 13, next, the structure shown in FIG. 12 is cleaned (for example, cleaning with pure water) and the metal bump 13 is then mounted on the connecting surface 21A of the connecting pad 21 on which the accumulated solder 15 is formed, and the accumulated solder 15 is thus bonded to the metal bump 13 (a bonding step).

At this time, also in the case in which the metal bump 13 has a variation in a height or the case in which the wiring board 11 has a warpage, the accumulated solder 15 is thicker than the conventional solder 104. Therefore, it is possible to bond the metal bump 13 to the accumulated solder 15. Consequently, it is possible to enhance the electrical connecting reliability between the wiring board 11 and the semiconductor chip 12.

As a step shown in FIG. 14, subsequently, the underfill resin 16 is formed to fill the clearance between the semiconductor chip 12 and the wiring board 11 by a capillarity (an underfill resin forming step). By forming the underfill resin 16 to fill the clearance between the semiconductor chip 12 and the wiring board 11, thus, it is possible to increase the connecting strength between the semiconductor chip 12 and the wiring board 11 (particularly, the strength of the bonding portion of the accumulated solder 15 and the metal bump 13).

Figure 14:
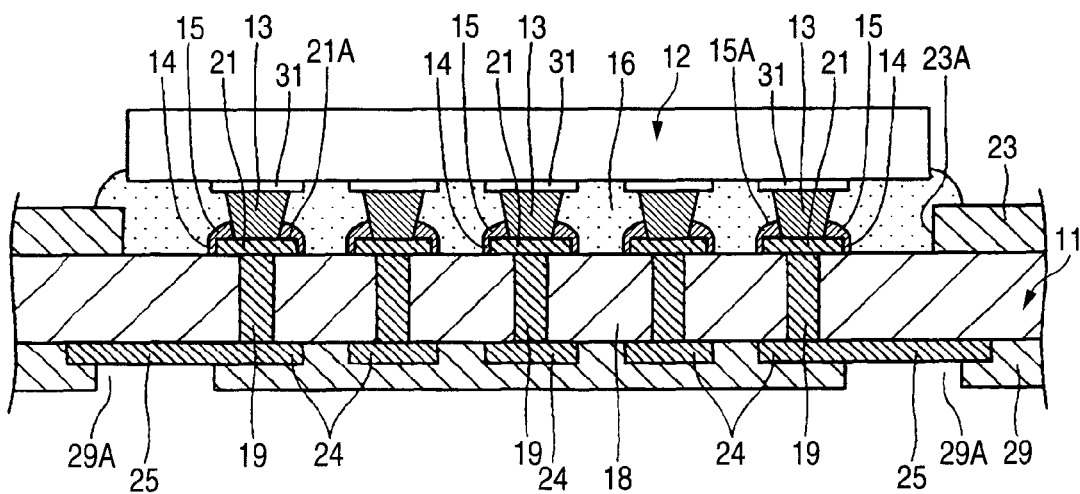
FIG. 14 is a view (No. 6) showing a step of manufacturing the semiconductor device according to the embodiment of the invention.
Figure 15:
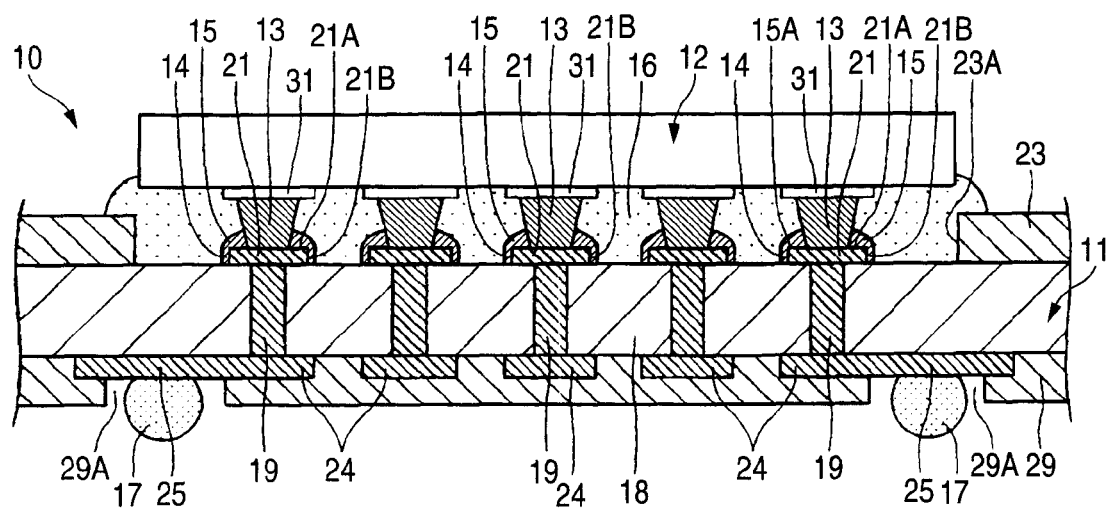
FIG. 15 is a view (No. 7) showing a step of manufacturing the semiconductor device according to the embodiment of the invention.

At a step shown in FIG. 15, then, the solder ball 17 is formed on the pad 25 in a state in which the structure shown in FIG. 14 is heated. Consequently, there is manufactured the semiconductor device 10 in which the semiconductor chip 12 and the wiring board 11 are flip chip connected to each other. A fine void is not present in the solder 14 and the accumulated solder 15 which are provided in the structure shown in FIG. 14. Therefore, the Sn contained in the solder 14 and the accumulated solder 15 which are provided in the structure shown in FIG. 14 can be prevented from being diffused into the electrode pad 31 of the semiconductor chip 12 through the metal bump 13 through a heat treatment at the step shown in FIG. 15.

According to the method of manufacturing the semiconductor device in accordance with the embodiment, the accumulated solder 15 having a greater thickness than the solder 104 formed on the connecting pad 108 according to the conventional art is formed on the connecting surface 21A. Also in the case in which the metal bump 13 has a variation in a height or the case in which a warpage is generated on the wiring board 11, consequently, it is possible to bond the accumulated solder 15 to the metal bump 13. Therefore, it is possible to enhance the electrical connecting reliability between the wiring board 11 and the semiconductor chip 12.

Before the metal bump 13 and the accumulated solder 15 are bonded to each other, moreover, the solder 14 is molten. Consequently, it is possible to eliminate a fine void present in the solder 14 formed by the plating method from the solder 14 provided on the connecting surface 21A of the connecting pad 21 and the accumulated solder 15. Thus, the solder 14 provided on the connecting surface 21A of the connecting pad 21 and the accumulated solder 15 have compact structures. Therefore, the Sn contained in the accumulated solder 15 can be prevented from being diffused into the electrode pad 31 through the metal bump 13 at a heat treating step in a formation of the solder ball 17 on the pad 25 of the wiring board 11 (see FIG. 15) or a high temperature inspecting step of the semiconductor device 10, for example.

While the description has been given by taking, as an example, the case in which the solder ball 17 to function as the external connecting terminal is provided in the semiconductor device 10 in the embodiment, the embodiment can also be applied to a semiconductor device which does not comprise the solder ball 17.

While the preferred embodiment according to the invention has been described above in detail, the invention is not restricted to the specific embodiment but various changes and modifications can be made without departing from the scope of the invention described in the claims.

The invention can be applied to a method of manufacturing a semiconductor device in which a solder provided on a connecting pad of a wiring board is bonded to a metal bump provided on an electrode pad of a semiconductor chip, and the semiconductor chip is thus flip chip connected to the wiring board.

What is claimed is:
1. A method of manufacturing a semiconductor device including a semiconductor chip having a plurality of electrode pads and a wiring board having a connecting pad formed thereon which is opposed to the electrode pads, a metal bump formed of a first metal provided on the electrode pads being bonded to a solder provided on the connecting pad, to flip-chip connect the semiconductor chip to the wiring board, the method comprising:

a solder forming step of forming the solder of a second metal different from the first metal on a connecting surface of the connecting pad which is opposed to the metal bump and a side surface of the connecting pad by a plating method, the formed solder on the connecting surface of the connecting pad and the side surface of the connecting pad having a first thickness, an accumulated solder forming step of melting the formed solder to provide accumulated solder on the connecting surface of the connecting pad, said accumulated solder being formed by a plating method and including the formed solder from the side surface of the connecting pad which moves to the connecting surface of the connecting pad by surface tension, said accumulated solder having a convex shape and a second thickness greater than the first thickness on the connecting surface of the connecting pad, and after forming the accumulated solder, a bonding step of moving the metal bump toward and into engagement with the connecting surface and with the accumulated solder, said accumulated solder bonding with the metal bump and coming into contact with the bump, the connecting pad, and b1 an exposed surface of the wiring board respectively in a surface.

2. The method of manufacturing a semiconductor device according to claim 1, wherein
the solder is formed by an electrolytic plating method at the solder forming step.

3. The method of manufacturing a semiconductor device according to claim 1, wherein
the solder is melted at the accumulated solder forming step by heating the solder at a temperature which is equal to or higher than a melting point of the solder and is lower than a heat resistant temperature of the semiconductor chip.

4. The method of manufacturing a semiconductor device according to claim 1, further comprising:
an underfill resin forming step of forming an underfill resin to fill a clearance between the semiconductor chip and the wiring board after the bonding step.

5. The method of manufacturing a semiconductor device according to claim 1, wherein
solder on the side surface of the connecting pad following the accumulated solder forming step has a third thickness that is less than the first thickness.

6. The method of manufacturing a semiconductor device according to claim 1, wherein the convex shape the accumulated solder takes during the accumulated solder forming step is different than a shape the solder takes upon forming on the connecting pad during the solder forming step.

* * * * *